INSULATED-GATE FIELD EFFECT TRANSISTOR WITH NONPLANAR GATE ELECTRODE STRUCTURE FOR OPTIMIZING TRANSCONDUCTANCE

Filed Sept. 29, 1965

INVENTORS
LEROY L. CHANG
LEO ESAKI

BY [signature]

ATTORNEY

United States Patent Office 3,450,960
Patented June 17, 1969

3,450,960

INSULATED-GATE FIELD EFFECT TRANSISTOR WITH NONPLANAR GATE ELECTRODE STRUCTURE FOR OPTIMIZING TRANSCONDUCTANCE

Leroy L. Chang, Croton-on-Hudson, and Leo Esaki, Chappaqua, N.Y., assignors to International Business Machines Corporation, Armonk, N.Y., a corporation of New York Filed Sept. 29, 1965, Ser. No. 491,201
Int. Cl. H01l 2/35
U.S. Cl. 317—235 16 Claims

ABSTRACT OF THE DISCLOSURE

An insulated-gate field effect transistor includes a gate electrode formed in nonplanar, or corrugated fashion so as to apply electric fields having a nonuniform distribution transverse to the conduction channel. Accordingly, conduction between source and drain electrodes is controlled primarily along a small portion of the conduction channel which reduces essentially to a point at the threshold voltage whereby transconductance $g_m$ is substantially increased and approaches infinity for small changes in gate electrode bias from the "cut off" voltage. Alternatively, the gate electrode can be formed in split-fashion, one segment being corrugated and remaining, or auxiliary, segments being planar to increase the gain-bandwidth product.

This invention relates to field effect transistors and, more particularly, to an insulated-gate field effect transistor having a novel gate structure arrangement for optimizing transconductance $g_m$.

At the present time, industry is directing much effort toward developing solid-state active devices suitable for batch-fabrication techniques. By batch-fabrication is meant that a number of solid-state active devices can be concurrently fabricated onto a single substrate along with functional connections therebetween, such substrate either forming or not forming a constituent part of the active devices. By batch-fabricating such devices, it is hoped that certain problems due to the complexity of present-day electronic systems and, also, the objectionable high cost of fabricating the same can be overcome. Primarily, the objectives of such development are to reduce size, weight, and unit cost of the solid-state active devices and, also, to improve reliability, speed, and power utilization from the system viewpoint.

Numerous solid-state devices suitable for batch-fabrication have been described in the literature. One such device is the insulated-gate field effect transistor. Basically, an insulated-gate field effect transistor comprises a metallic gate electrode spaced from the surface of a block, or wafer, of appropriately-doped semiconductor material, e.g., silicon (Si), by a thin insulating layer, e.g., genetically-formed silicon dioxide ($SiO_2$). In addition, source and drain electrodes are defined by diffused-spaced portions of opposite conductivity type in the surface of the semiconductor wafer. The semiconductor wafer, therefore, forms a constituent part of the insulated-gate field effect transistor structure in defining a conduction channel for majority carriers between the source and drain electrodes and, also, provides support for the total structure. Moreover, the insulated-gate field effect transistor is adaptable to batch-fabrication due to the simplicity of the fabrication process; for example, source and drain electrodes are formed concurrently by a single diffusion and, also, the gate electrode and functional interconnections to and from the insulated-gate field effect transistor can be formed by a same metallization process. The operation of the insulated-gate field effect transistor closely approximates that of a vacuum tube triode since it is a voltage-controlled device and "working currents" between source and drain electrodes are supported only by majority carriers, the majority carrier density along the conduction channel being modulated by electrical fields generated when the gate electrode is biased. This device obviously requires fewer process steps per function in comparison with the ordinary bipolar transistor.

Certain limitations are inherent in insulated-gate field effect transistors which are attributable to the presence of donor surface state along the conduction channel resulting from the character of the silicon-silicon dioxide interface. In an NPN insulated-gate field effect transistor, these donor states define an ohmic conduction path (inversion layer) between source and drain electrodes whereby such transistor normally exhibits a depletion mode operation, i.e., substantially source-drain current $I_{sd}$ flows at zero-gate bias. Similarly, in the PNP insulated-gate field effect transistor, these donor states define an accumulation layer whereby large negative-gate bias is required to draw source-drain current $I_{sd}$ whereby such transistor normally exhibits an enhancement-mode operation. From the logic circuit point of view, enhancement-mode operation exhibited by the PNP insulated-gate field effect transistor is preferred as it allows direct coupling between the active devices; however, the NPN insulated-gate field effect transistor is of particular interest as it exhibits a higher carrier mobility $\mu$ than does the PNP-type device.

In the fabrication of an insulated-gate field effect transistor, whether the PNP-type or NPN-type, a transconductance $g_m$ is defined as $dI_{sd}/dV_g$, where $V_g$ is the gate bias voltage. The desirability of a high transconductance $g_m$ in an active device is well known, for example, so as to achieve a high rate of change of source-drain current $I_{sd}$ per unit of gate bias voltage $V_g$. Also, and of particular importance from a circuit designer's viewpoint, an increased transconductance $g_m$ provides an improved gain-bandwidth product and, therefore, would increase the speed of an operative circuit arrangement. For example, gain-bandwidth product of an insulated-gate field effect transistor is related to the transconductance $g_m$ by the expression $g_m/C$, where C is the gate electrode capacitance. Accordingly, if transconductance $g_m$ of the insulated-gate field effect transistor can be increased, not only can larger magnitudes of source-drain current $I_{sd}$ be controlled per unit of gate bias voltage $V_g$ but, more importantly, the gain-bandwidth product, or speed, of such device can be improved. Also, similar effects are achieved if gate electrode capacitance C can be reduced.

Accordingly, an object of this invention is to provide a novel insulated-gate field effect transistor structure exhibiting a high transconductance $g_m$.

Another object of this invention is to provide an insulated-gate field effect transistor structure exhibiting an improved gain-bandwidth product.

Another object of this invention is to provide a gate electrode configuration in an insulated-gate field effect transistor structure to provide a high transconductance $g_m$ and, concurrently, a reduced gate capacitance whereby a large gain-bandwidth product is obtained.

These and other objects and advantages of this invention are obtained by forming the gate electrode of the insulated-gate field effect transistor in nonplanar fashion so that as to apply electrical fields having a nonuniform distribution at the wafer surface, i.e., transverse to the conduction channel. By nonplanar is meant, for example, that the plane of the gate electrode is not parallel with that of the wafer surface. Also, the gate electrode can be formed to include one or more portions, i.e., corrugations, without the major plane of the gate electrode and extending transverse to the conduction channel of the insulated-gate field effect transistor. Accordingly, when the gate electrode is biased, the electrical fields E applied at the wafer surface are not uniformly distributed, and conduction between source and drain electrodes, i.e., source-drain current $I_{sd}$, is primarily controlled along a very small portion of the conduction channel. The portion of the conduction channel, along which the flow of source-drain current $I_{sd}$ is controlled, reduces essentially to a point at the threshold conditions, i.e., gate bias voltage $V_{gc}$ which is just insufficient to support useful source-drain current $I_{sd}$. At threshold conditions, the "effective" length L′ of the conduction channel is minimal and, therefore, the transconductance $g_m$ of the insulated-gate field effect transistor is substantially increased. Transconductance $g_m$ of an insulated-gate field effect transistor can be defined as $\epsilon\mu V_{sd}W/aL'$, where $\epsilon$ is the dielectric constant of the insulating layer, $\mu$ is the majority carrier mobility, $V_{sd}$ is the voltage applied across the source and drain electrodes, W is the transverse width of the conduction channel, $a$ is the insulating layer thickness for the planar case, and L′ is the effective channel length ($L'=L$ in the planar structure where L is the geometrical channel length). Significantly, the total charge density Q of majority carriers per unit area along remaining portions of the conduction channel is sufficient at threshold to support source-drain current $I_{sd}$. Accordingly, for small changes in gate electrode bias from "cut-off" voltage $V_{gc}$, transconductance $g_m$ approaches infinity and a large source-drain current $I_{sd}$ is realized for a small change in gate bias voltage.

The novel gate electrode structure of this invention differs over prior art structures in being formed in nonplanar or corrugated fashion whereby a nonuniform electrical field distribution is realized at the wafer surface, i.e., conduction channel. Whether the gate electrode structure is corrugated in concave or convex fashion, the flow of majority carriers, i.e., source-drain current $I_{sd}$, is controlled, i.e., valved, only along a small transverse portion of the conduction channel adjacent the corrugation. For example, in the case of a silicon NPN-type field effect transistor, the intensity of electrical fields E applied at that portion of the conduction channel adjacent a concave corrugation when the gate electrode is biased at $V_{gc}$ is just sufficient to deplete such portion whereby such transistor is "cut-off" albeit the charge density Q along remaining portions of the conduction channel is sufficient to support source-drain current $I_{sd}$. Similarly, in the silicon PNP-type field effect transistor, wherein the conduction channel is normally depleted, electrical fields E generated when a gate electrode having a convex corrugation is biased at "cut-off' voltage $V_{gc}$ are sufficient to invert the conduction channel except at that portion adjacent the corrugation whereat the electrical field intensity is minimal. Accordingly, in either the NPN-type or PNP-type field effect transistor, a minimal change from gate bias voltage $V_{gc}$ is effective to induce substantial source-drain current $I_{sd}$ and transconductance $g_m$ *is* substantially increased. Also, it is evident that if excess acceptor states are induced along conduction channel 15 whereby an NPN-type structure exhibits enhancement mode operation and the PNP-type structure exhibits depletion mode operation, convex and concave corrugation, respectively, would be provided in the gate electrode structure to achieve the objects of this invention.

Also, alternate embodiments of this invention are disclosed wherein the gate capacitance C is reduced to improve the gain-bandwidth product. In such embodiments, the gate electrode is formed in split-fashion, one segment being corrugated whereas remaining segments are formed in planar fashion. The corrugated segment operates substantially as described in providing a nonuniform electrical field distribution to the adjacent portion of the conduction channel whereby the "effective" length L′ is substantially reduced. On the other hand, the planar, or auxiliary, segments of the gate electrode are independently biased to control the charge density Q and, thereby, invert adjacent portions of the conduction channel. In these alternate embodiments, the flow of majority carriers, i.e., source-drain current $I_{sd}$, again is controlled along a very narrow transverse segment of the conduction channel adjacent the corrugated segment of the gate electrode. However, gate capacitance C is reduced since the corrugated segment of the gate electrode singularly controls the flow of source-drain current.

The foregoing and other objects, features and advantages of the invention will be apparent from the following more particular description of preferred embodiments of the invention, as illustrated in the accompanying drawings.

Figure 1A:
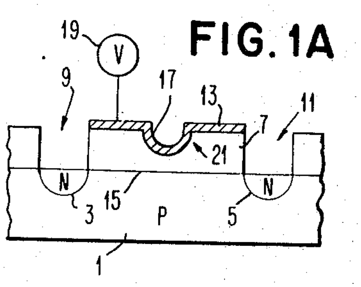
FIGS. 1A and 2A illustrate insulated-gate field effect transistors having gate electrodes which include concave and convex corrugations, respectively.

Referring to FIG. 1A, an NPN insulated-gate field effect transistor is illustrated as comprising a p-type wafer 1 of relatively high resistivity semiconductor material, e.g., silicon (Si), and having diffused source and drain electrodes 3 and 5 of n-type conductivity. Source and drain electrodes 3 and 5 normally define rectifying junctions with wafer 1. An insulating layer 7 is genetically formed over the surface of wafer 1; insulating layer 7 can be used for masking purposes during the diffusion of source and drain electrodes 3 and 5. For example, insulating layer 7 can be formed of thermally-grown silica ($SiO_2$) by exposing wafer 1 at approximately 1250° C. to an atmosphere of either oxygen ($O_2$), oxygen and water vapor ($O_2+H_2O$), or carbon dioxide ($CO_2$) for a time sufficient to be formed in a thickness of approximately 5000 A. When formed, "diffusion windows" 9 and 11 are opened in insulating layer 7 by conventional photolithographic techniques. For example, a layer of photoresist material can be applied over the surface of insulating layer 7 and reacted, e.g., photolytically or by particle irradiation, over all portions except selected areas where windows 9 and 11 are to be opened. The photoresist material is "developed" by washing with an appropriate solvent to remove unreacted portions of the photoresist material and expose the selected surface areas of insulating layer 7. A suitable silicon dioxide etchant, e.g., hydrofluoric acid (HF), is employed to etch windows 9 and 11, reacted portions of the photoresist material being subsequently removed by an appropriate solvent. With insulating layer 7 acting as a diffusion mask, wafer 1 is heated at temperatures ranging between 1100° C. and 1250° C. in a reactive atmosphere, for example, of phosphorus pentoxide ($P_2O_5$), to form n-type source and drain diffusions 3 and 5. Additionally, insulating layer 7 serves to electrically insulate wafer 1 and thin film metallizations, for example, operative connections to source and drain electrodes 3 and 5, not shown, and metallic gate electrode 13 which can be concurrently formed by conventional processes. Gate electrode 13 is registered in electrical field-applying relationship with the narrow surface portion of wafer 1 defining conduction channel 15 between source and drain electrodes 3 and 5.

In accordance with particular aspects of this invention, gate electrode 13 of FIG. 1A includes a concave corrugation 17 arranged transverse to the path of majority carrier flow along conduction channel 15. To more fully appreciate the effects of the gate electrode structure of FIG. 1A, conduction in an insulated-gate field effect transistor is primarily a surface mechanism, the charge density Q of majority carriers along conduction channel 15 being modulated by electrical fields E generated when gate electrode 13 is biased by source 19. In the NPN-type structure of FIG. 1A, holes are repelled from the silicon-silicon dioxide interface and from conduction channel 15 when gate electrode 13 is positively biased; when positive-gate bias is sufficient, electrons are attached into conduction channel 15 whereby an ohmic connection (inversion layer) is defined between source and drain electrodes 3 and 5. However, excess donor states along conduction channel 15 due to the character of the silicon-silicon dioxide interface in an NPN-type structure normally define such inversion layer whereby a finite source-drain current $I_{sd}$ flows along conduction channel 15 at zero-gate bias when source and drain electrodes are appropriately biased (depletion mode operation). Conversely, in the PNP-type structure of FIG. 2A, hereinafter described, excess donor states along conduction channel 15 define an accumulation layer between source and drain electrodes 3 and 5 whereby a deeper enhancement mode operation results. It is noted that these donor states are distributed uniformly along the silicon-silicon dioxide interface. The presence of excess donor states along the conduction channel 15 cannot be avoided except by special treatments in present day fabrication techniques since they arise due to the character of the silicon-silicon dioxide interface. For example, the density of donor states at the silicon-silicon dioxide interface of an insulated-gate field effect transistor can be controlled by selective doping of the narrow surface portion of wafer 1 as described in patent application Ser. No. 457,571, filed on May 21, 1965 in the name of F. Fang et al., and assigned to the assignee of the present invention.

In prior art insulated-gate field effect transistor structures including planar gate electrodes, the charge density Q of majority carriers is modulated along the entire length L of conduction channel 15 by appropriately biasing the gate electrode to drive, for example, the NPN-type structure into "cut-off" (depletion mode operation) or the PNP-type structure into "conduction" (enhancement mode operation). Accordingly, since transconductance $g_m$ of an insulated-gate field effect transistor varies inversely as the length L of conduction channel 15, such parameter is not optimized. It has been appreciated that transconductance $g_m$ could be increased by reducing the length L of the condition channel; however, the spacing between source and drain electrodes in an insulated-gate field effect transistor structure is limited by practical considerations. The effect of the concave corrugation 17 and the convex corrugation 17' in gate electrode 13 of FIGS. 1A and 2A, respectively, is to reduce the "effective" length of conduction channel 15 by controlling source-drain current $I_{sd}$ flow along a very small segment of the conduction channel. The "effective" length L' of conduction channel 15 is minimal due to the nonuniform distribution of electrical fields E when gate electrode 13 is biased by voltage source 19 at near threshold conditions. In FIG. 1A, electrical fields of maximum intensity are applied at that portion of conduction channel adjacent corrugation 17; in FIG. 2A, electrical fields E of minimum intensity are applied along portion of conduction channel 15 adjacent corrugation 17'. In the NPN-type structure shown in FIG. 1A and, also, the PNP-type structure shown in FIG. 2A, charge density Q per unit area along conduction channel 15 but for that portion adjacent the corrugation is sufficient to support source-drain current $I_{sd}$.

Referring again to FIG. 1A, the "effective" length L' of conduction channel 15 is defined as that portion opposing corrugation 17 in gate electrode 13 and reduces to zero at threshold conditions. To form corrugation 17, an additional chemical etching process is effected prior to metallization of gate electrode 13 so as to define recess 21 having a semicircular cross-section and extending transverse to conduction channel 15. The duration of the additional chemical etching process is insufficient to erode through the entire thickness of insulating layer 7; rather, a small thickness of insulating layer 7 remains between the bottom of recess 21 and the surface of wafer 1. Alternatively, recess 21 can be formed in a graded-stepped fashion by a series of chemical etching processes wherein "etch windows" defined in the successive layers of photoresist material are made progressively smaller. Gate electrode 13, when metallized, is nonplanar and the electrical field distribution at the surfaceof wafer 1, when gate electrode 13 is biased by source 19, is nonuniform as illustrated in FIG. 1B.

Figures 1B, 1C:
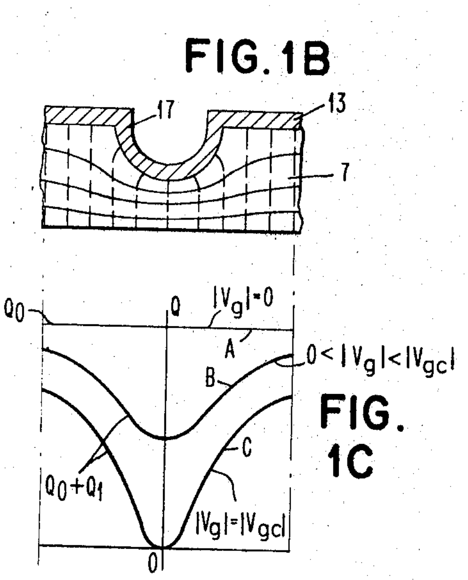
FIGS. 1B and 2B illustrate the electrical field lines and equipotential lines in the insulating layer due to the concave and convex corrugations of FIGS. 1A and 2A, respectively.
FIGS. 1C and 2C illustrate the density of majority carriers along the conduction channels of the showing of FIGS. 1A and 1B, respectively, when the respective nonplanar gate electrodes are biased.

In FIG. 1B, electrical field lines are illustrated in dashed fashion while the equipotential lines are shown in solid fashion. As hereinabove stated, the NPN-type structure of FIG. 1A is normally depleted and, hence, the surface charge $Q_0$ of residual majority carriers along conduction channel 15 is normally sufficient to define an inversion layer. To "cut-off" the NPN-type structure of FIG. 1A, a negative gate bias is applied to gate electrode 13 by source 19 to compensate the residual charge density $Q_0$ along conduction channel 15. Due to corrugation 17, such compensation is nonuniform. When gate electrode 13 is biased negatively, electrical fields E of greatest intensity are applied at the portions of conduction channel 15 adjacent corrugation 17 since the thickness of insulating layer 7 is minimal at this point. Accordingly, induced surface charge $Q_1$, given by $\epsilon E$, where $\epsilon$ the dielectric constant of insulating layer 7, is greatest along the adjacent portion of conduction channel 15 whereby residual electrons are compensated to the largest degree; residual electrons along other portions of conduction channel 15 toward the source and drain electrodes 3 and 5, respectively, are less compensated, such compensation following essentially a bell-type curve as shown in FIG. 1C.

As shown by A in FIG. 1C, the charge density $Q_0$ of residual electrons, or "built-in" charge, at zero-gate bias is substantially uniform along the length of conduction channel 15. As the gate bias voltage is increased negatively, say to $-V_g$, the charge density Q, given by residual charge $Q_0$ less induced surface charge $Q_1$, along portions of conduction channel 15 adjacent corrugation 17 having a radius $r$ is less than along portions opposing planar sections of gate electrode 13, as shown by curve B of FIG. 1C. When gate bias voltage is increased to a critical value $V_{gc}$, induced surface charge $Q_1$ induced along the adjacent portion of conduction channel 15 is sufficient to balance the residual charge density $Q_0$, as shown by C in FIG. 1C, and inhibit source-drain current $I_{sd}$, albeit the charge density Q per unit area along remaining portions of conduction channel 15 would be sufficient to support source-drain current $I_{sd}$. Since the intensity of the electrical fields E is peaked, the "effective" length L' of conduction channel 15 is essentially reduced to a point near threshold conditions. Accordingly, for a small change in gate bias voltage from critical gate voltage $V_{gc}$, a substantial source-drain current $I_{sd}$ is obtained and transconductance $g_m$ of the NPN insulated-gate field effect transistor approaches infinity.

Figure 3:
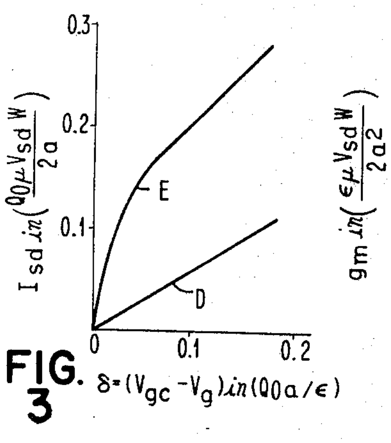
FIGS. 3 and 4 are graphs which illustrate the beneficial results obtained by forming the gate electrode in nonplanar fashion.
Figure 4:
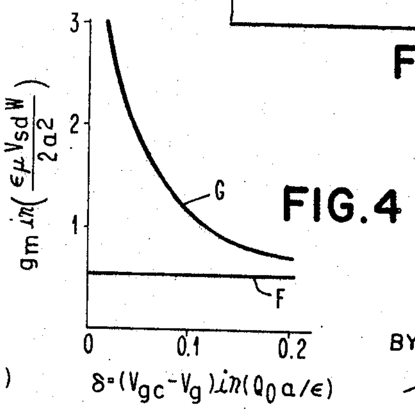

In FIGS. 3 and 4, source-drain current $I_{sd}$ versus gate voltage change $\delta$ and, also, transconductance $g_m$ versus gate voltage change $\delta$ are plotted so as to illustrate the advantages of the nonplanar gate electrode 13 of FIG. 1A. For this purpose, it is assumed that $L=4a$ and $r=a/2$. The deviation of $V_g$ from its cut-off value is used as the abscissa. Since conduction in the NPN-type structure of FIG. 1A is controlled along the small adjacent portion of conduction channel 15, remaining portions being inverted, the magnitude of source-drain current $I_{sd}$ obtained is larger than that obtained for a same change $\delta$ in gate bias voltage in conventional insulated-gate field effect transistors employing planar gate electrode structures. When a planar gate electrode is employed, source-drain current $I_{sd}$ increases as a linear function of the gate voltage change $\delta$ from threshold as illustrated by curve D of FIG. 3, the source-drain current being given by $\mu Q_0 V_{sd} W/2a$. Due to corrugation 17, a larger magnitude of source-drain current $I_{sd}$ for a given gate voltage change $\delta$ is obtained as shown in curve E of FIG. 3. Also, for a small gate voltage change $\delta$, transconductance $g_m$ is very much enhanced and approaches infinity at near threshold conditions as illustrated in FIG. 4 by curve F. For example, when planar gate electrode structures are employed, the transconductance $g_m$ is given by the expression $\epsilon\mu V_{sd}W/aL$, or $\frac{1}{2}(\epsilon\mu V_{sd}W/2a^2)$, $a$ and $\epsilon$ are the thickness and dielectric constant, respectively, of insulating layer 7. Since the electrical field distribution is constant over the surface of wafer 1, the transconductance $g_m$ is substantially as shown by curve F of FIG. 4. As a result of the nonuniform electrical field distribution due to corrugation 17, having a radius $r$, the "effective" length L′ of conduction channel 15 is approximately given by:

$$\pi a\left(1-\frac{r^2}{a^2}\right)\sqrt{1-\frac{V_g}{V_{gc}}}\cosh^{-1}\left(\frac{a}{r}\right)$$

Accordingly, as gate bias voltage $V_g$ approaches threshold gate voltage $V_{gc}$ the "effective" length L′ of the conduction channel reduces to zero and the transconductance $g_m$ increases to infinity as shown by curve G of FIG. 4.

Figure 2A:
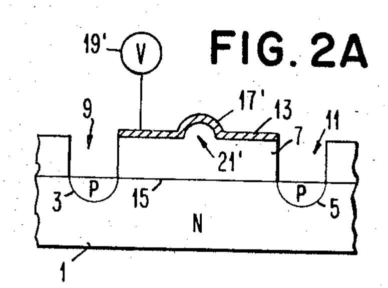
Figures 2B, 2C:
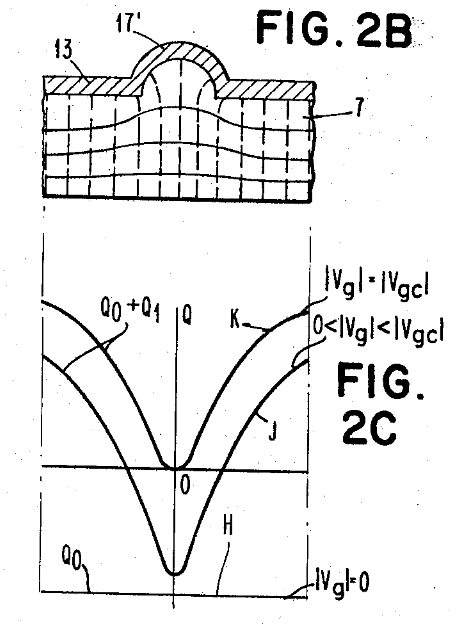

In FIG. 2A wherein like reference characters are employed to denote corresponding structures, a PNP insulated-gate field effect transistor, is illustrated as comprising gate electrode 13 including a convex corrugation 17′ formed over protuberance 21′ in insulating layer 7. Protuberance 21′, for example, can be formed in a graded-stepped fashion by a series of chemical etching processes wherein "etch windows" defined in the successive layers of photoresist material are made progressively larger, gate electrode 13 being formed by standard metallization techniques. Alternatively, protuberance 21′ can be formed in cusped-fashion by a single chemical etching process. Due to the convex corrugation 17′, the induced surface charge $Q_1$ per unit of gate bias voltage is greater along portions of conduction channel 15 adjacent planar portions of gate electrode 13 than adjacent corrugation 17′. For example, in the enlarged view of corrugation 17′ illustrated in FIG. 2B, electrical field intensity at the surface of wafer 1 adjacent protuberance 21′ is minimal and, accordingly, the induced surface charge $Q_1$ per unit of gate bias voltage is minimal. For example, the residual charge density $Q_0$ along conduction channel 15 is illustrated by curve H in FIG. 2C. To obtain useful source-drain current $I_{sd}$, gate electrode 13 is biased negatively at $-V_g$ by source 19′ to increase the charge density Q of holes along conduction channel 15. Since the intensity of electrical fields E applied at the adjacent portion of conduction channel 15 is minimal, the charge density Q along portions of conduction channel 15 adjacent planar portions of gate electrode 13 increases at a faster rate as shown in curve J of FIG. 2C and, accordingly, becomes first inverted. Again, and as illustrated in FIG. 2C, the "effective" length L′ of conduction channel 15 is substantially reduced to a point at threshold, i.e., gate voltage $V_{gc}$, as shown by curve K in FIG. 2C whereby the flow of source-drain current $I_{sd}$ is controlled at a point. When the gate bias voltage $V_g$ only slightly exceeds $V_{gc}$, the charge density Q of majority carriers along the entire length of conduction channel 15 is sufficient to support useful source-drain current $I_{sd}$. As in the case of the PNP-type structure, hereinabove described, "turn-on" of source-drain current $I_{sd}$ is effected at a very small portion of conduction channel 15 whereby transconductance $g_m$ is substantially increased. The effects achieved by the use of a convex corrugation 17′ are similar to those described regarding the provision of concave corrugation 17 in gate electrode 13 and as graphically shown in FIGS. 3 and 4.

Figure 5:
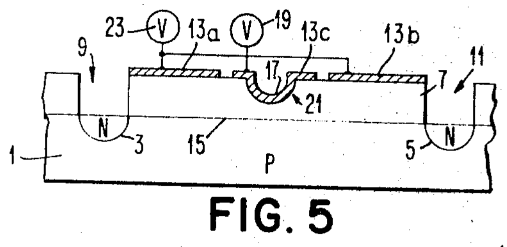
FIGS. 5 and 6 illustrate nonplanar gate electrodes formed in split-fashion to provide a controllable density of majority carriers along the respective conduction channel and a reduced gate capacitance.
Figure 6:
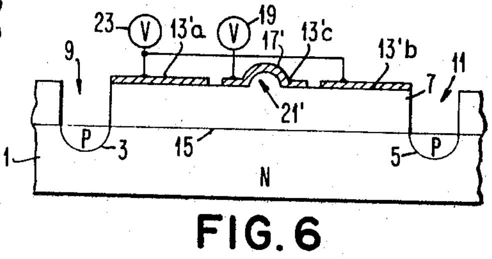

Alternate embodiments of insulated-gate field effect transistors in accordance with this invention are illustrated in FIGS. 5 and 6 wherein the novel gate electrode structure is formed in split-fashion. As hereinabove described, the gain-bandwidth product of an insulated-gate field effect transistor is directly related to the transconductance $g_m$ and is inversely related to gate capacitance C, i.e., $g_m/C$. By forming the gate electrode structure in split-fashion as shown in FIGS. 5 and 6, gate capacitance C is detremined only by the corrugated, or active, portion which controls the flow of source-drain current $I_{sd}$. Accordingly, in the showings of FIGS. 5 and 6, not only is transconductance $g_m$ increased but, also, gate capacitance C is reduced whereby substantial improvement in the gain-bandwidth product is obtained. For example, referring to FIG. 5, an NPN insulated-gate field effect transistor is illustrated wherein the gate metallization is defined by auxiliary planar portions **13*a* and 13*b* and active portion 13*c* including concave corrugation 17. Each of the gate sections 13*a* and 13*b* and 13*c* are effective to modulate the charge density Q along the adjacent surfaces of wafer 1. Auxiliary portions 13*a* and 13*b* are biased, by a common source 23 to provide a desired charge density Q along the adjacent normally-inverted surfaces of wafer 1. Active portion 13*c* including corrugation 17 is independently biased by source 19 to singularly control the "cut-off" of source-drain current $I_{sd}$ and, in effect, reduce the "effective" length L′ of conduction channel 15, as hereinabove described. Also, in the PNP insulated-gate field effect transistor illustrated in FIG. 6, a split-gate structure comprising auxiliary planar portions 13*a′* and 13*b′* and active portion 13*c′* including convex corrugation 17′. Although conduction channel 15 in the PNP-type structure is normally depleted (enhancement mode operation), auxiliary portions 13*a′* and 13*b′* are biased by source 23′ to provide a desired charge density Q whereby the adjacent surfaces of wafer 1 are inverted and active portion 13*c′* is independently biased by source 19′ to "turn-on" source-drain current $I_{sd}$. In the structure shown in FIGS. 5 and 6, electrical field distribution at the surface of wafer 1 is nonuniform due to corrugated active portions 13*c* and 13*c′*, respectively, as shown in FIGS. 1B and 2B, respectively. Also, in FIGS. 5 and 6, gate capacitance C is determined only by the corrugated active portions 13*c* and 13*c′*, respectively, which singularly control the flow of source-drain current $I_{sd}$ along conduction channel 15; the capacitance of auxiliary portions 13*a* and 13*b* of FIG. 5 and 13*a′* and 13*b′* of FIG. 6 is incidental since the opposing surfaces of wafer 1 are inverted. Accordingly, not only is the "effective" length L′ of conduction channel 15 minimal but, also, gate capacitance C is substantially reduced whereby the respective gain-bandwidth products are improved. It will be appreciated that, since the planar auxiliary portions of the gate metallization of FIGS. 5 and 6 are biased to either invert or accumulate the surfaces of wafer 1** and since the control of source-drain current $I_{sd}$ is effected only by the active portion of the gate metallization, the corrugation provided in such active portion can be either concave or convex.

While the invention has been particularly shown and described with reference to preferred embodiment thereof, it will be understood by those skilled in the art that various changes in form and details may be made therein without departing from the spirit and scope of the invention.

What is claimed is:

1. An insulated-gate field effect transistor comprising a semiconductor wafer of first conductivity type having a major surface and spaced diffused portions of second conductivity type in said major surface defining source and drain electrodes, portions of said major surface intermediate said source and drain electrodes defining a conduction channel, and a gate electrode structure in insulated electrical field-applying relationship with said conduction channel, at least a section of said gate electrode transverse to said conduction channel being nonplanar with respect to the opposing section of said conduction channel for applying electrical fields having a nonuniform distribution transverse to said conduction channel.

2. An insulated-gate field effect transistor as defined in claim 1 wherein said semiconductor wafer is formed of p-type material and said section of said gate electrode structure includes at least one concave corrugated portion transverse to said conduction channel.

3. An insulated-gate field effect transistor as defined in claim 1 wherein said semiconductor wafer is formed of n-type material and said section of said gate electrode structure includes at least one convex corrugated portion transverse to said conduction channel.

4. An insulated-gate field effect transistor comprising a semiconductor wafer of one conductivity type and having diffused spaced surface portions of opposite conductivity type defining source and drain electrodes, portions of the surface of said wafer intermediate said source and drain electrodes defining a conduction channel, and means insulated from said intermediate surface portions for applying electrical fields having a substantially symmetrical and nonuniform intensity distribution transverse to said intermediate surface portions to control the charge density along said conduction channel in nonuniform fashion.

5. An insulated-gate field effect transistor as defined in claim 4 wherein said applying means includes a gate electrode structure having at least one section which is nonplanar with respect to the opposing section of said intermediate surface portions, and means for biasing said gate electrode structure to provide a charge density along all but a minor part of said intermediate surface portions sufficient to support source-drain current along said conduction channel when said source and drain electrodes are appropriately biased.

6. An insulated-gate field effect transistor as defined in claim 4 wherein said applying means includes means for applying electrical fields along a major part of said intermediate surface portions to establish a charge density therealong sufficient to support source-drain current along said conduction channel when said source and drain electrodes are appropriately biased.

7. An insulated-gate field effect transistor as defined in claim 6 wherein said applying means includes further means for applying electrical fields along a minor part of said intermediate surface portions for modulating carrier density therealong whereby said source-drain current along said conduction channel is controlled.

8. An insulated-gate field effect transistor comprising a wafer of semiconductor material of one conductivity type having diffused spaced surface regions of opposite conductivity type for defining source and drain electrodes, surface portions intermediate said source and drain electrodes defining a conduction channel, a layer of insulating material formed over said conduction channel, an intermediate portion of said insulating layer extensive with and transverse to said conduction channel being of a different thickness than remaining portions of said insulating layer, and a gate electrode formed on said intermediate portion and said remaining portions of said insulating layer and registered with said conduction channel, and means for biasing said gate electrode whereby electrical fields applied at said intermediate surface portions defining said conduction channel are nonuniformly distributed and the charge density along said conduction channel is nonuniform.

9. An insulated-gate field effect transistor comprising a semiconductor wafer of one conductivity type having a planar surface and diffused spaced portions of opposite conductivity type formed in said surface for defining source and drain electrodes, portions of said surface intermediate said source and drain electrodes defining a conduction channel, and a gate electrode registered in insulated fashion with said intermediate surface portions, said gate electrode including at least one corrugated portion along an intermediate section thereof and transverse to said conduction channel, and means for biasing said gate electrode to provide a nonuniform distribution of charge density along said conduction channel is nonuniform.

10. An insulated-gate field effect transistor as defined in claim 9 wherein said biasing means includes variable voltage means for biasing said gate electrode at a first level to establish carrier density along said conduction channel sufficient to support source-drain current when said source and drain electrodes are appropriately biased and at a second level sufficient to reduce the charge density along that section of said conduction channel registered with said one corrugated portion sufficient to inhibit said source-drain current.

11. An insulated-gate field effect transistor comprising a semiconductor wafer of one conductivity type having a planar surface and diffused spaced portions of opposite conductivity type formed in said surface for defining source and drain electrodes, portions of said surface intermediate said diffused spaced portions defining a conduction channel, electrical field-applying means insulated from and registered with said intermediate surface portions, said field-applying means including at least one planar gate electrode structure and at least one nonplanar gate electrode structure including at least one corrugated portion transverse to said conduction channel, and means for independently biasing said planar and said nonplanar gate electrode structures whereby the distribution of electrical fields at said intermediate surface portions is nonuniform.

12. An insulated-gate field effect transistor as defined in claim 11 wherein said biasing means includes first means for biasing said one planar gate electrode structure to provide a desired carrier density at least sufficient to invert adjacent portions of said intermediate surface portions and variable means for biasing said one nonplanar gate electrode structure to modulate carrier density along adjacent portions of said intermediate surface portions whereby said one nonplanar gate electrode structure is singularly effective to modulate carrier flow between said source and drain electrodes when appropriately biased.

13. An insulated-gate field effect transistor as defined in claim 11 wherein said semiconductor wafer is formed of p-type material and said one nonplanar gate electrode structure includes at least one concave corrugation.

14. An insulated-gate field effect transistor as defined in claim 11 wherein said semiconductor wafer is formed of n-type material and said one nonplanar gate electrode structure includes at least one convex corrugation.

15. An insulated-gate field effect transistor as defined in claim 11 wherein the surface area of said one planar gate electrode structure is greater than the planar area of said one nonplanar gate electrode structure.

16. An insulated-gate field effect transistor comprising a semiconductor wafer of one conductivity type having a planar surface and diffused spaced portions of opposite conductivity type in said surface defining source and drain electrodes, portions of said surface intermediate said source and drain electrodes defining a conduction channel, conduction between source and drain electrodes and along said conduction channel being controlled by modulation of carrier density along said conduction channel, and means insulated from and registered with said intermediate surface portions for modulating the carrier density along said conduction channel in nonuniform fashion and for controlling carrier density along a small transverse portion of said conduction channel which reduces to a point at threshold conditions so as to inhibit majority carrier flow between said source and drain electrodes.

References Cited

UNITED STATES PATENTS

| | | | |
|---|---|---|---|
| 2,869,055 | 1/1959 | Noyce | 317—235 |
| 2,936,425 | 5/1960 | Shockley | 330—39 |
| 2,951,191 | 8/1960 | Herzog | 317—235 |
| 2,952,804 | 9/1960 | Franke | 317—235 |
| 2,967,985 | 1/1961 | Shockley et al. | 317—235 |
| 2,994,811 | 8/1961 | Senitzky | 317—235 |
| 3,098,160 | 7/1963 | Noyce | 307—88.5 |
| 3,328,601 | 6/1967 | Rosenbaum | 307—88.5 |
| 3,333,115 | 7/1967 | Kawakami | 317—235 |
| 3,339,128 | 8/1967 | Olmstead et al. | 317—235 |
| 3,358,198 | 12/1967 | Overbeek | 317—235 |
| 3,374,406 | 3/1968 | Wallmark | 317—235 |

JOHN W. HUCKERT, *Primary Examiner.*

R. SANDLER, *Assistant Examiner.*